(12) United States Patent
Lan

(10) Patent No.: US 10,451,355 B2
(45) Date of Patent: Oct. 22, 2019

(54) HEAT DISSIPATION ELEMENT

(71) Applicant: ASIA VITAL COMPONENTS CO., LTD., New Taipei (TW)

(72) Inventor: Wen-Ji Lan, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 15/281,013

(22) Filed: Sep. 29, 2016

(65) Prior Publication Data

US 2017/0347489 A1 Nov. 30, 2017

Related U.S. Application Data

(63) Continuation-in-part of application No. 15/166,279, filed on May 27, 2016.

(51) Int. Cl.
*F28D 15/02* (2006.01)
*H01L 23/427* (2006.01)
*H01L 21/48* (2006.01)

(52) U.S. Cl.
CPC ..... *F28D 15/0275* (2013.01); *F28D 15/0233* (2013.01); *H01L 21/4882* (2013.01); *H01L 23/427* (2013.01)

(58) Field of Classification Search
CPC ............ H05K 7/20336; F28D 15/0266; F28D 15/0275; F28D 15/0233; F28F 3/08; H01L 21/4882; H01L 23/427
USPC .................................................... 165/104.26
See application file for complete search history.

(56) References Cited

U.S. PATENT DOCUMENTS

| | | | | |
|---|---|---|---|---|
| 6,250,378 B1* | 6/2001 | Kobayashi | .......... | F28D 15/0266 165/104.33 |
| 6,253,836 B1* | 7/2001 | Mitchell | ............. | F28D 15/0233 165/104.33 |
| 2006/0283577 A1* | 12/2006 | Liu | ........................ | F28D 15/043 165/104.26 |
| 2007/0199682 A1* | 8/2007 | Hwang | ................. | F28D 15/046 165/104.26 |
| 2007/0227703 A1* | 10/2007 | Bhatti | ..................... | F28D 15/02 165/104.26 |
| 2008/0078202 A1* | 4/2008 | Luo | ......................... | F25B 21/02 62/485 |
| 2008/0264608 A1* | 10/2008 | Tye | ..................... | F28D 15/0266 165/104.14 |
| 2009/0242174 A1* | 10/2009 | McCutchen | ........ | F28D 15/0233 165/104.25 |

(Continued)

*Primary Examiner* — Raheena R Malik
(74) *Attorney, Agent, or Firm* — Jackson IPG PLLC; Demian K. Jackson

(57) ABSTRACT

A heat dissipation element includes a first and a second housing, and a first and a second working fluid. The first housing has a first inner space. At least one pipe is formed on one side of the first housing and has a second inner space. The first and the second inner space are communicable and together define a first chamber. The second housing has a second chamber. A first and a second working fluid is, respectively, provided in the first and the second chamber. One side of the second housing is fixedly connected to one end of the pipe. The first and the second chamber are incommunicable. With these arrangements, the heat dissipation element not only can provide better heat spreading and heat transfer effect, but also can be produced at largely lower manufacturing costs.

13 Claims, 18 Drawing Sheets

(56) References Cited

U.S. PATENT DOCUMENTS

| | | | |
|---|---|---|---|
| 2012/0043060 A1* | 2/2012 | Wang | F28D 15/0266 |
| | | | 165/104.26 |
| 2012/0111538 A1* | 5/2012 | Wang | F28D 15/0266 |
| | | | 165/104.21 |
| 2014/0138058 A1* | 5/2014 | Hyde | F28D 15/04 |
| | | | 165/104.26 |
| 2014/0182819 A1* | 7/2014 | Yang | F28D 15/02 |
| | | | 165/104.26 |
| 2016/0128234 A1* | 5/2016 | Uesugi | H05K 7/20336 |
| | | | 361/700 |
| 2017/0153066 A1* | 6/2017 | Lin | F28D 15/0266 |

* cited by examiner

HEAT DISSIPATION ELEMENT

The present application is a continuation in part of U.S. patent application Ser. No. 15/166,279, filed on May 27, 2016.

FIELD OF THE INVENTION

The present invention relates to a heat dissipation element, and more specifically, to a heat dissipation element that can be produced at largely lower manufacturing costs but have better heat transfer effect.

BACKGROUND OF THE INVENTION

With the constant advancement of semiconductor technology, the trend of the currently available integrated circuit (IC) is toward small volume. Nowadays, several times in the quantity of computing elements than previously are provided in the same volume IC. As number the computing elements increasing, the computation of the IC at high speed also produce much more heat during operation thereof. For example, when the central processing unit (CPU) is in high load usage, the heat it generates can burn out the entire CPU. Therefore, heat dissipation devices are vital to the ICs.

CPUs, chips, or other electronic elements of electronic products are all heat sources. Therefore, heat pipes, vapor chambers, flat heat pipes, and so forth which provide excellent heat dissipation effect and heat transfer effect to remove heat produced by the heat sources when operation. The heat pipe mainly dissipates at a remote distance. One side of the heat pipe absorbs heat produced by the heat-generating elements and then evaporated. Thereafter, the evaporated heat is dissipated via a condensing section and condensed into liquid due to capillary force, then flowed back to the evaporating section to complete the whole inclosed circulation. The vapor chamber is used to spread the heat produced by large area in electronic products in two dimensions across the vapor chamber area (in-plane spreading) and also conduct the heat in a vertical direction (through-plane). The produced heat is absorbed from one side of the vapor chamber in contact with heat sources and then transferred to the other side of the vapor chamber to dissipate.

However, the heat pipe and the vapor chamber have lower heat exchange efficiency since they can only dissipate or transfer the produced heat in the electronic products in areas connected to the heat sources with no effects of heat spreading and heat dissipation, or heat dissipation effect at a remote distance.

SUMMARY OF THE INVENTION

To solve the above problems, a primary object of the present invention is to provide a heat dissipation element that can be produced at largely lower manufacturing costs.

Another object of the present invention is to provide a heat dissipation element that can provide better heat spreading and heat transfer effect.

A further object of the present invention is to provide a heat dissipation element that can provide heat dissipation effect at a remote distance.

To achieve the above and other objects, the heat dissipation element provided according to the present invention includes a first and a second housing, and a first and a second working fluid. The first housing has a first inner space. At least one pipe is formed on one side of the first housing and has a second inner space. The first and the second inner space are communicable and together define a first chamber. The second housing has a second chamber. A first and a second working fluid is, respectively, provided in the first and the second chamber. One side of the second housing is fixedly connected to one end of the pipe. The first and the second chamber are incommunicable. With these arrangements, the heat dissipation element not only can provide better heat spreading and heat transfer effect, but also can be produced at largely lower manufacturing costs, as well as increased vapor-liquid circulation rate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
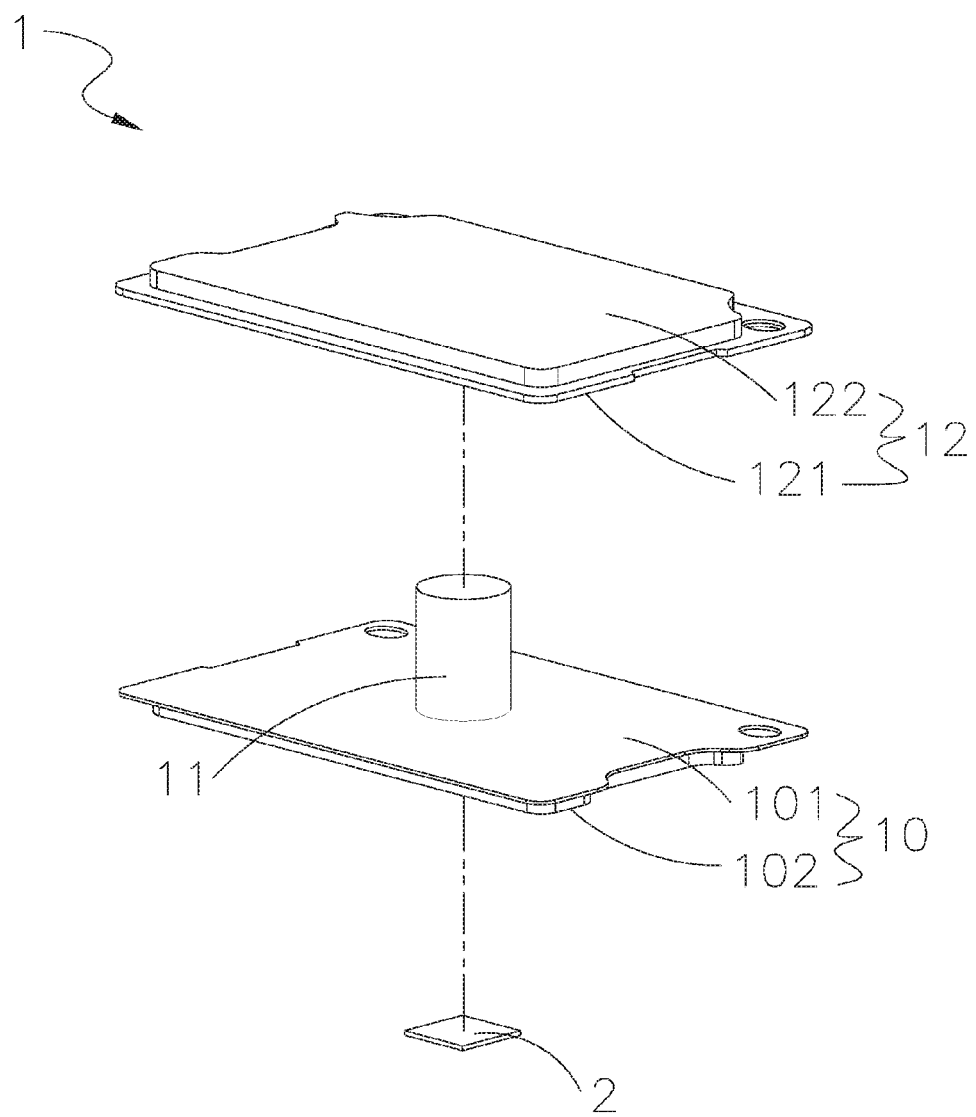
FIG. 1 is an exploded perspective view of a first embodiment of a heat dissipation element according to the present invention.

The present invention will now be described with some preferred embodiments thereof and by referring to the accompanying drawings. For the purpose of easy to understand, elements that are the same in the preferred embodiments are denoted by the same reference numerals.

Please refer to FIGS. 1 to 4, which are exploded and assembled perspective views, and assembled sectional and enlarged views, respectively, of a heat dissipation element 1 according to a first embodiment of the present invention. As shown, a heat dissipation element 1 includes a first and a second housing 10, 12, and a first and a second working fluid 14, 15. The first housing 10 has a first side 101 and an opposite second side 102, which are closed to each other to internally define a first inner space 103a. At least one pipe 11, which is formed by the first housing 10 being pressed with mechanical processing, is upwardly extended from and integrally formed with the first side 101 of the first housing 10, and has a second inner space 103b. The first and the second inner space 103a, 103b are communicable and together define a first chamber 103, which has a first wick structure 104 provided on an inner wall thereof. In the illustrated first embodiment, the number of the pipe 11 can be, for example but not limited to, one. However, in practical implementation, the number of the pipe 11 can be changed according to actual needs.

The second housing 12 has a third side 121 and an opposite fourth side 122, which are closed to each other to internally define a second chamber 123, in which a third wick structure 124 is provided. The third side 121 is connected to one end of the pipe 11 in a way, for example but not limited to, welding, mechanical processing, adhesive bonding, and direct attaching. The first and the second chamber 103, 123 are incommunicable.

The first and the second working fluid 14, 15 is, respectively, provided in the first and the second chamber 103, 123 and can be pure water, an inorganic compound, alcohols, ketones, a liquid metal, a refrigerant or an organic compound.

The first and the third wick structure 104, 124 is made of meshes, fiber structure, sintered powder structure, micro grooves, and mesh with sintered powder structure, or any combinations of them.

The first and the second housing 10, 12 can be, for example but not limited to, a vapor chamber or a heat pipe; however; they can be other materials which provide the same effect in practical implementation.

Figure 5:
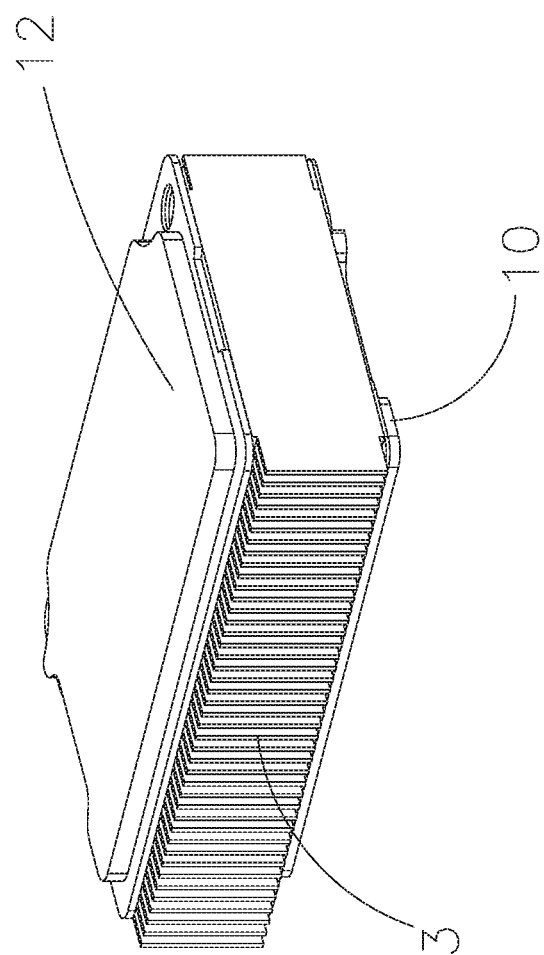
FIG. 5 is an example of use of the first embodiment of the heat dissipation element according to the present invention.

Referring to FIG. 5, which is an example of use of the first embodiment of the heat dissipation element 1 according to the present invention, as shown, the second side 102 of the first housing 10 is contacted with a heat source 2, such as Central Processing Unit (CPU), Microcontroller Unit (MCU), Graphics Processing Unit (GPU), winding, or other electronic elements which generate heat in operation, a heat radiation fin assembly 3 is provided between the first and the second housing 10, 12.

When the second side 102 of the first housing 10 is contacted with the heat source 2, heat produced by the heat source 2 is absorbed by the second side 102 of the first housing 10, such that the first working fluid 14 located at the first chamber 103 of the first housing 10 is heated and vaporized. Meanwhile, a part of the vaporized first working fluid 14 flows towards the first inner space 103a and is then condensed into liquid in the first inner space 103a when adjacent to the first side 101 of the first housing 10 with heat spreading effect of the heat radiation fin assembly 3. The liquid first working fluid 14 then quickly flows back to the first inner space 103a far from the first side 101 of the first housing 10 with the help of a capillary force and gravity of the first wick structure 104. Therefore, the vapor-liquid circulation of the first working fluid 14 is occurred in the first inner space 103a over and over again. Another part of the vaporized first working fluid 14 flows through the pipe 11 into the second inner space 103b. With the second housing 12 being connected to the first housing 10, this part of the vaporized first working fluid 14 is transferred the produced heat to the second housing 12 to dissipate, so as to achieve remote heat dissipation effect.

Figure 2:
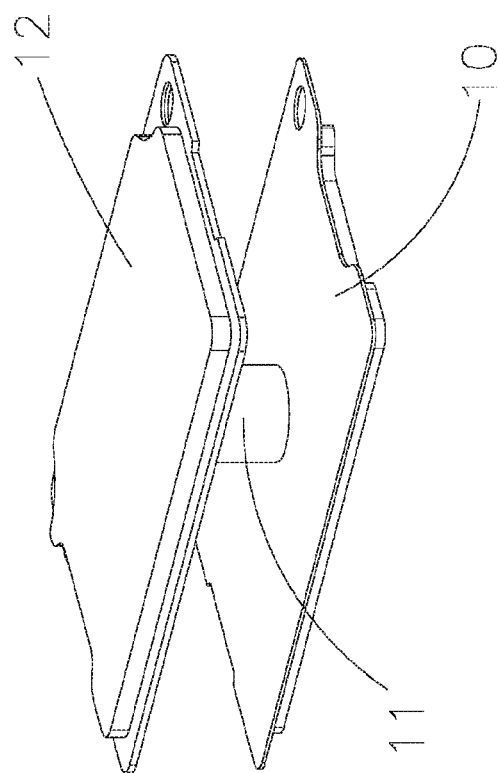
FIG. 2 is an assembled perspective view of FIG. 1.
Figure 3:
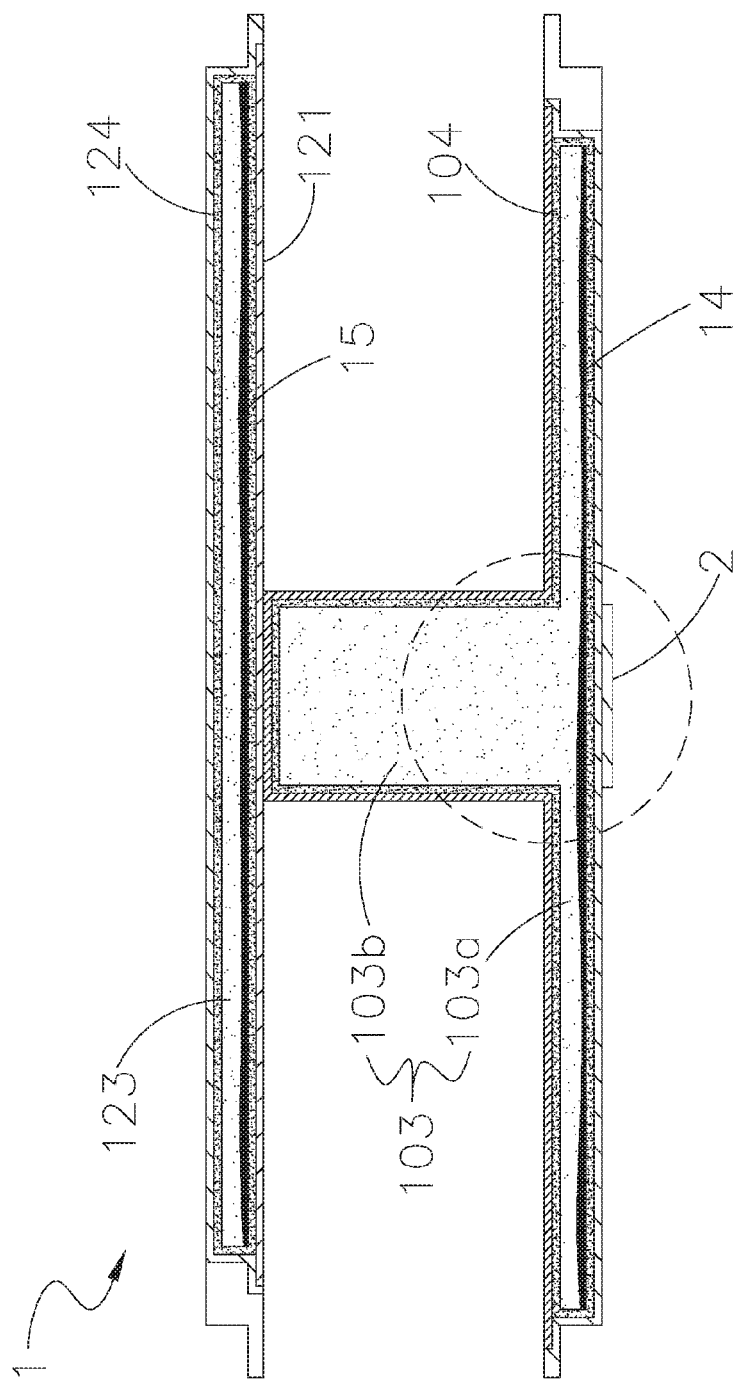
FIG. 3 is an assembled sectional view of the first embodiment of the heat dissipation element according to the present invention.
Figure 4:
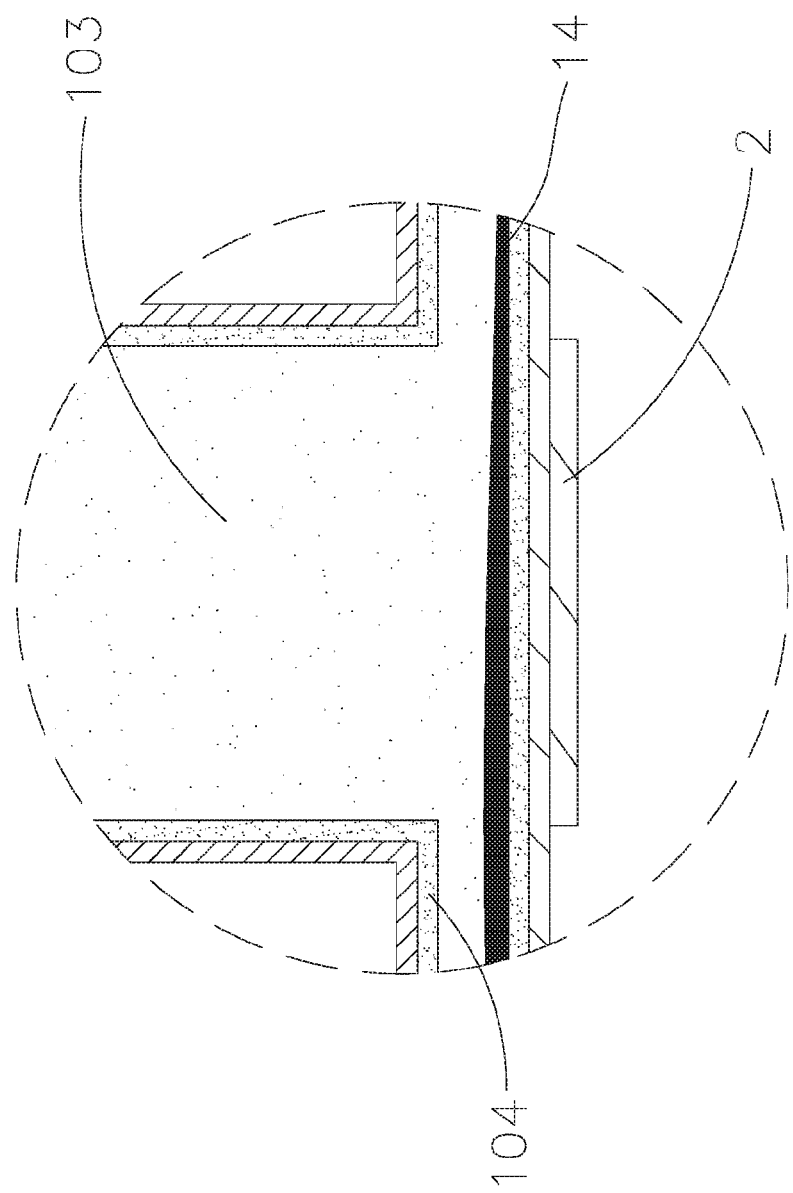
FIG. 4 is an enlarged view of the circled area in FIG. 3.
Figure 6:
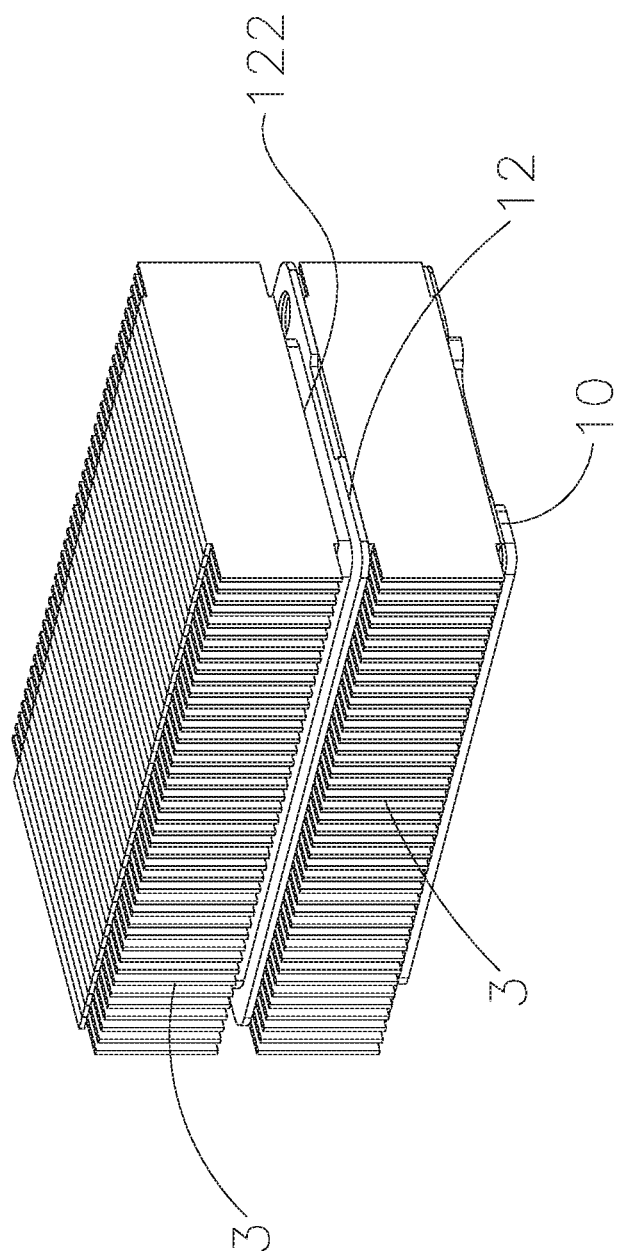
FIG. 6 is an example of use of a second embodiment of the heat dissipation element according to the present invention.

Please refer to FIGS. 1 to 3, along with FIG. 6, which is an example of use of a second embodiment of the heat dissipation element 1 according to the present invention. The second embodiment of the heat dissipation element 1 is generally structurally similar to the first embodiment except that, in this second embodiment, another heat radiation fin assembly 3 is attached to the fourth side 122 of the second housing 12. The heat radiation fin assembly 3 has a large contact area with air. With the large heat contact area, the produced heat can be quickly removed into the surrounding air to largely increase the overall heat dissipation efficiency of the heat dissipation element 1.

Figure 7:
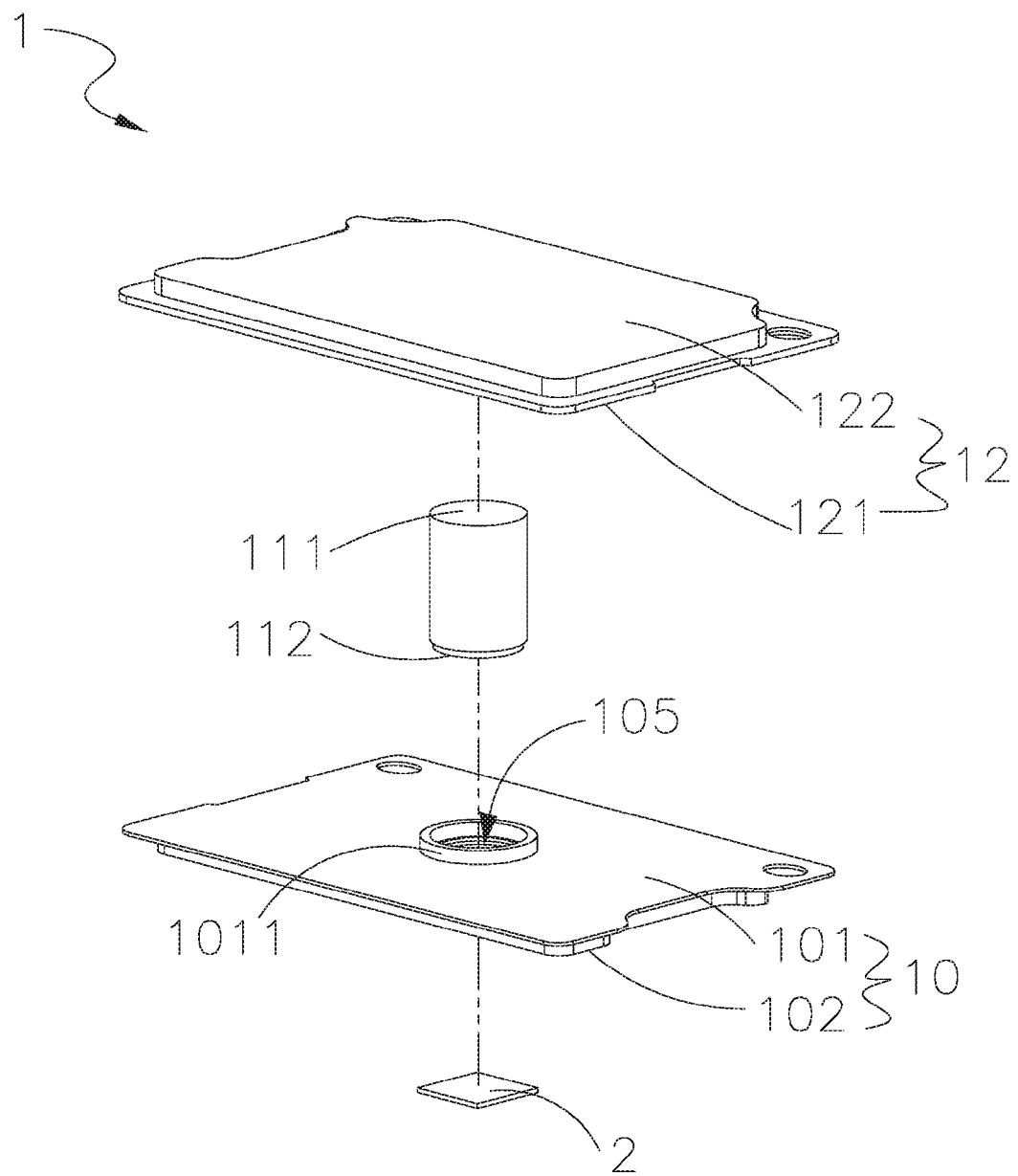
FIG. 7 is an exploded perspective view of the heat dissipation element of a third embodiment according to the present invention.
Figure 8:
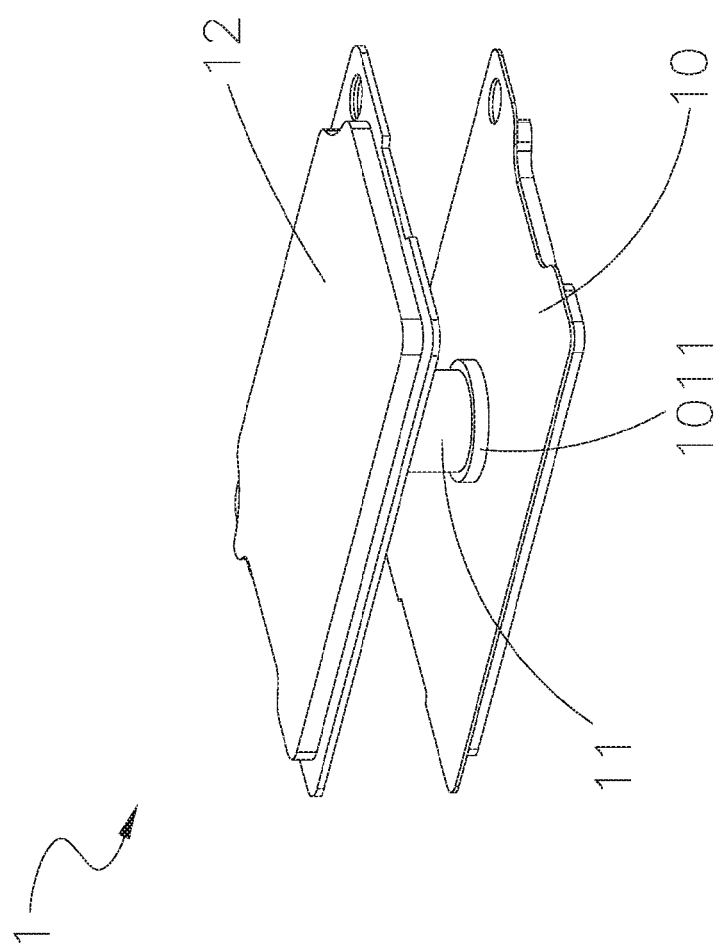
FIG. 8 is an assembled perspective view of FIG. 7.
Figure 9:
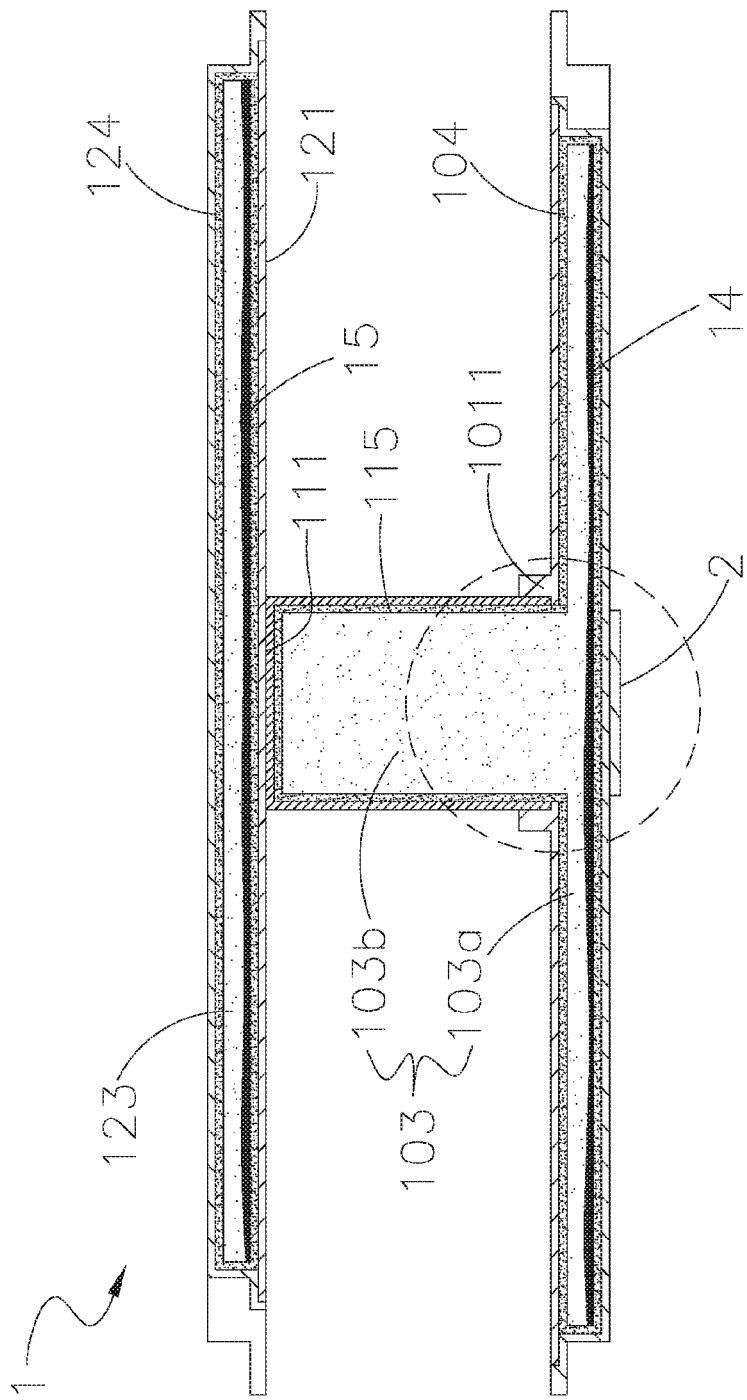
FIG. 9 is an assembled sectional view of the third embodiment of the heat dissipation element according to the present invention.
Figure 10:
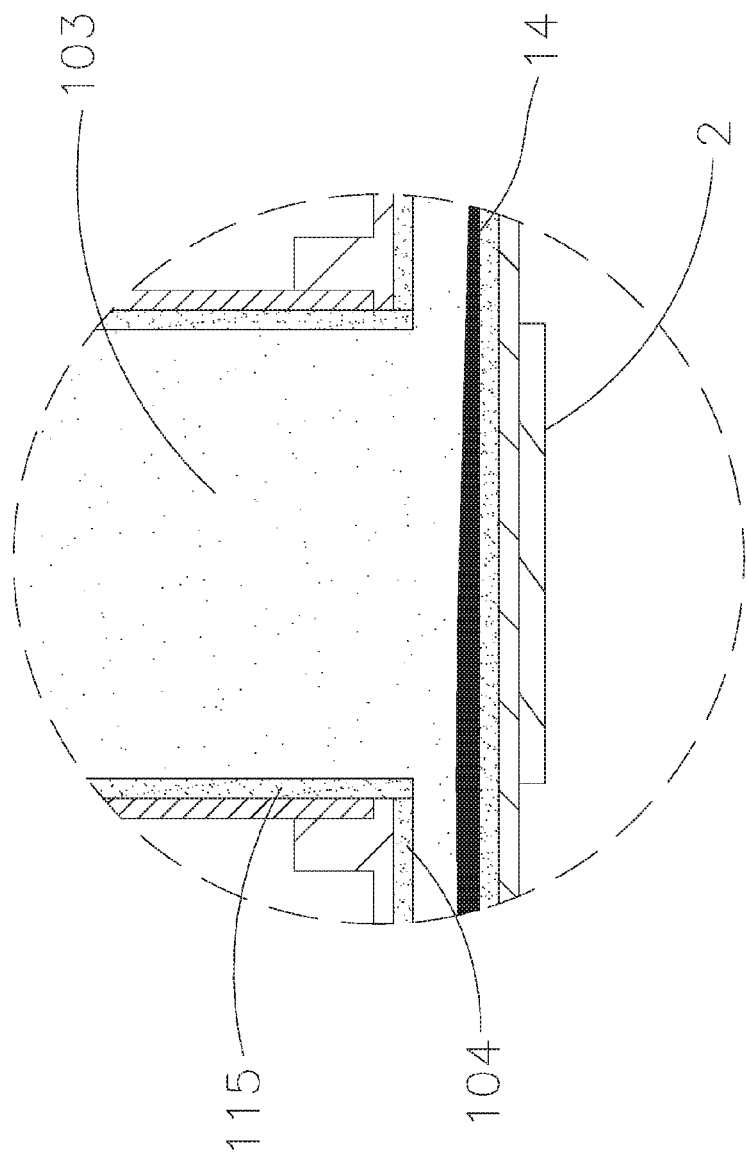
FIG. 10 is an enlarged view of the circled area in FIG. 9.
Figure 11:
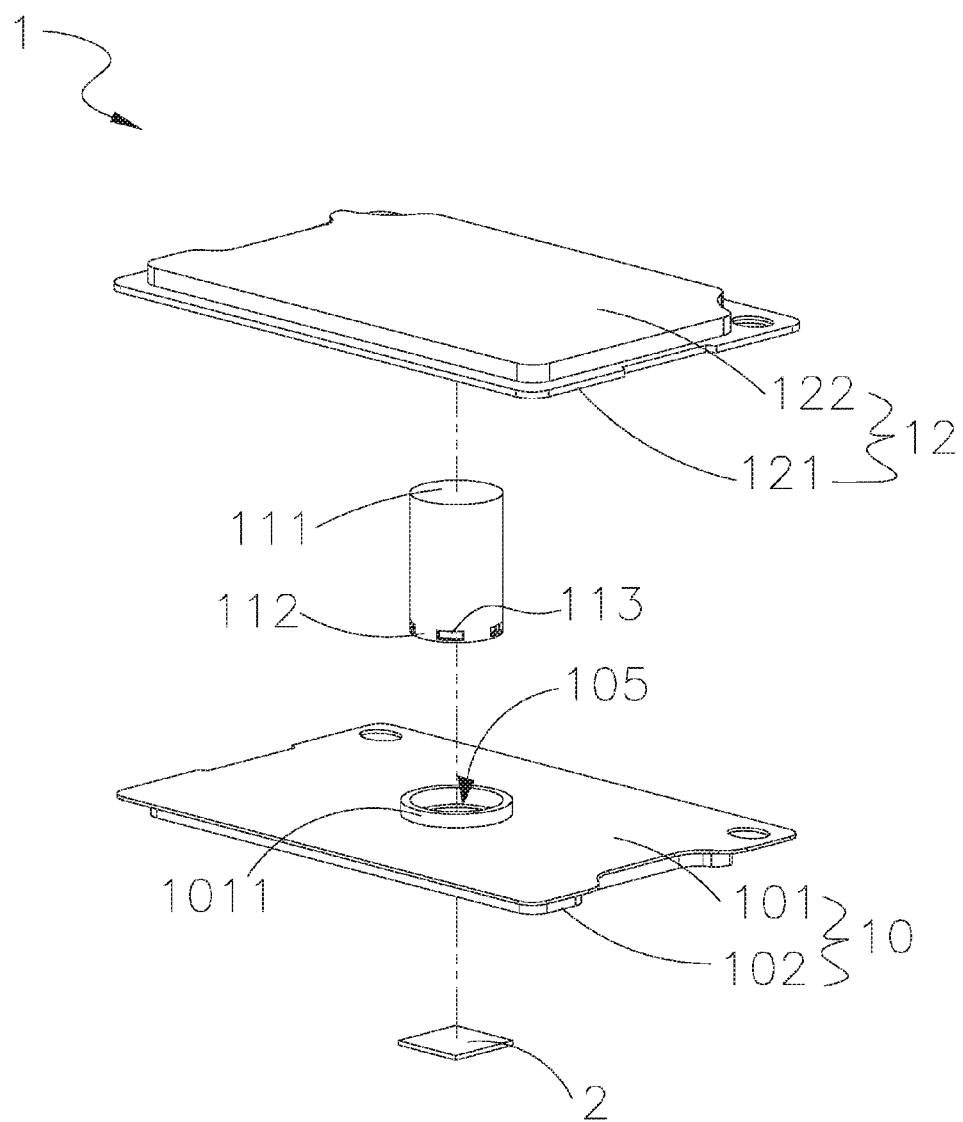
FIG. 11 is an exploded perspective view of the heat dissipation element according to a fourth embodiment of the present invention.
Figure 12:
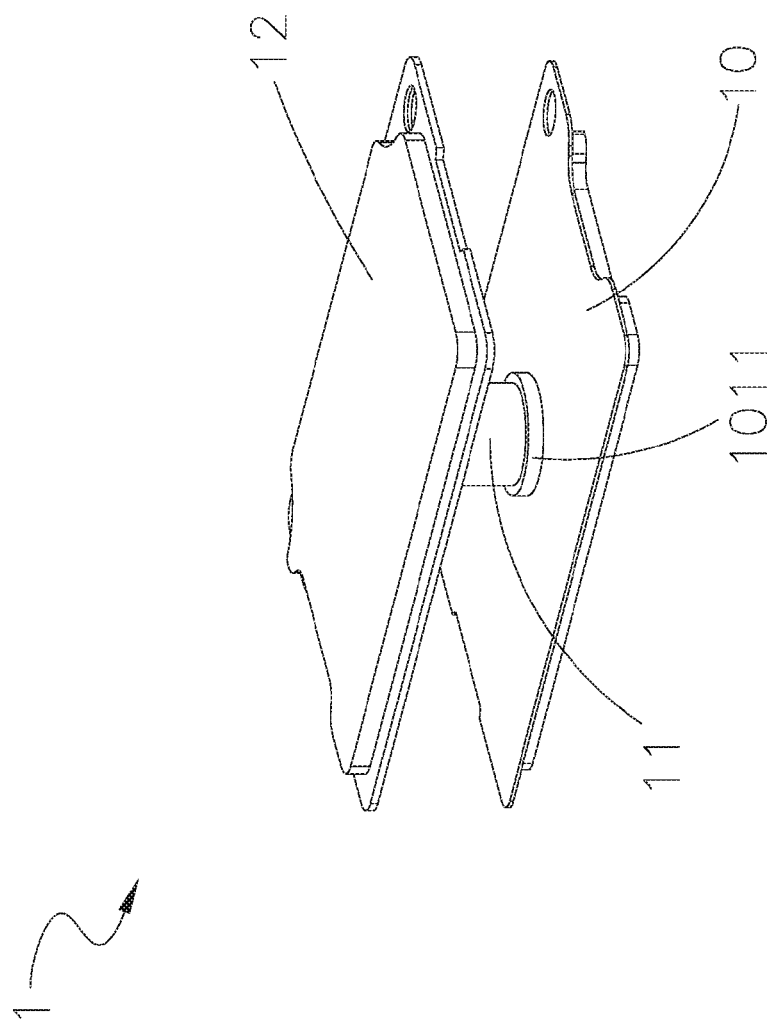
FIG. 12 is an assembled perspective view of FIG. 11.
Figure 13:
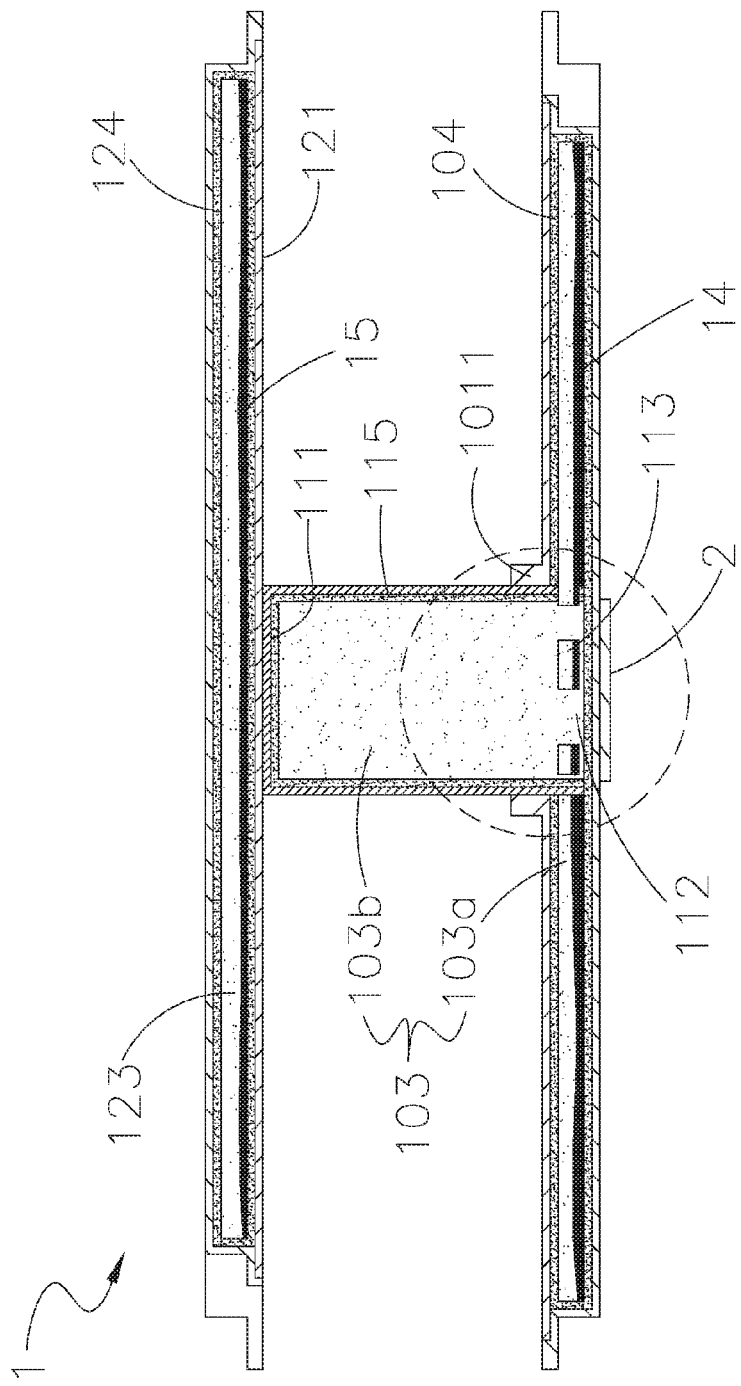
FIG. 13 is an assembled sectional view of the forth embodiment of the heat dissipation element according to the present invention.
Figure 14:
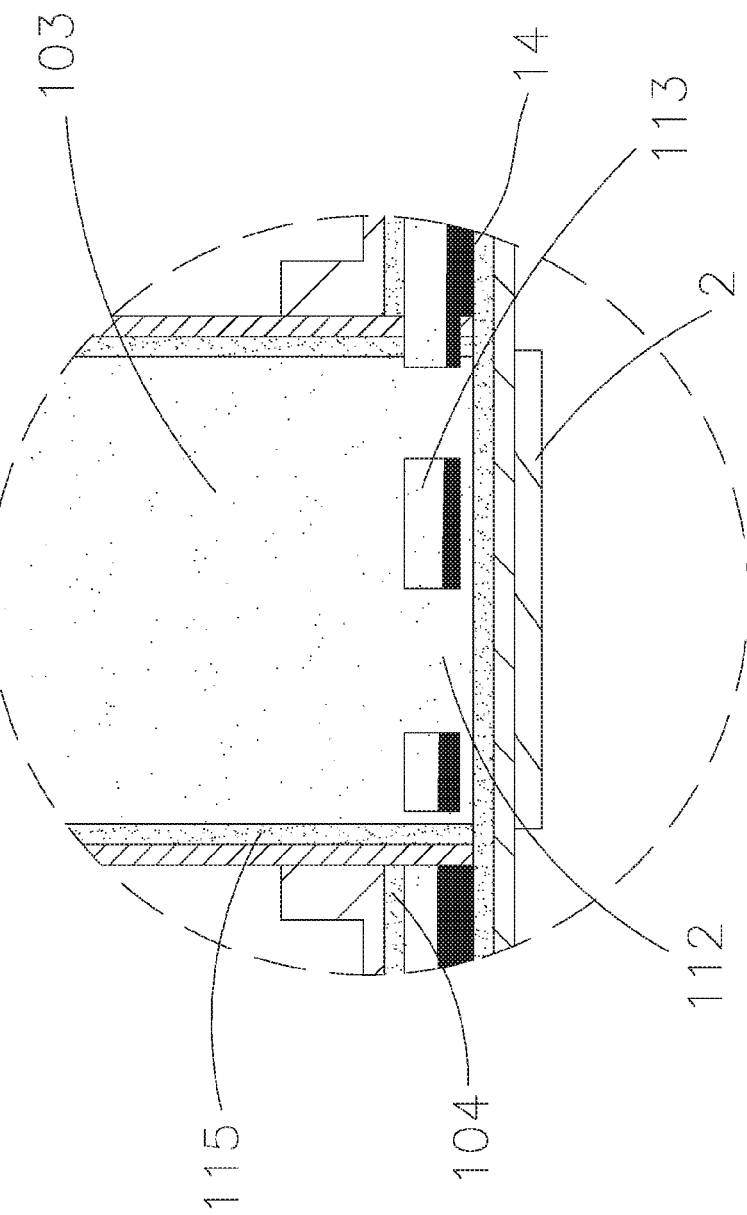
FIG. 14 is an enlarged view of the circled area in FIG. 13.

Please refer to FIGS. 7 to 9, which are exploded and assembled perspective views, and assembled sectional and enlarged views, respectively, of the heat dissipation element according to a third embodiment of the present invention, The third embodiment of the heat dissipation element 1 is generally structurally similar to the first and the second embodiments except that, in this third embodiment, at least one opening 105 is provided on the first side 101 and communicable with the first inner space 103a. The pipe 11 has a closed end 111 and an opposite open end 112, which together internally define the second inner space 103b. The open end 112 is communicated with the opening 105, such that the first and the second inner space 103a, 103b are communicable. A second wick structure 115 is provided on an inner wall of the second inner space 103b, which is connected to the first wick structure 104.

The wick connection here is referred to the porous structure in the first wick structure 104, which is connected to and communicated with the porous structure in the second wick structure 115, so capillary force of the second wick structure 115 can be transferred or extended to the first wick structure 104, such that the first working fluid 14 can be condensed into liquid and flowed from the second wick structure 115 of the pipe 11 back to the first wick structure 104 then the first inner space 103a with the help of a capillary force and gravity. The second wick structure is made of meshes, fiber structure, sintered powder structure, micro grooves, and mesh with sintered powder structure, or any combinations of them, which all have porous structures that can provide the capillary force to flow the working fluid.

In the illustrated third embodiment, the first side 101 of the first housing 10 further has a raised portion 1011 upwardly extended therefrom; and the raised portion 1011 is correspondingly formed on the periphery of the opening 105 of first housing 10. With increased contact area of the raised portion 1011, the pipe 11 can be fixedly connected to the first housing 10.

In the illustrated third embodiment, the pipe 11 can be, for example but not limited to, a pipe; however; it can be other materials, which provide the same effect, in practical implementation. The difference between the first and the third embodiment is that in this illustrated embodiment, the pipe 11 and the first side 101 are independent elements, which are connected to each other to form the first housing 10, which is combined with the second housing 2 to form the heat dissipation element 1.

Please refer to FIGS. 11 to 14, which are exploded and assembled perspective views, and assembled sectional and enlarged views, respectively, of the heat dissipation element according to a fourth embodiment of the present invention, along with FIGS. 7 to 9. The fourth embodiment of the heat dissipation element 1 is generally structurally similar to the first three embodiments except that, in this fourth embodiment, the open end 112 of pipe 11 is pressed against an inner wall of the second side 102 to vertically connect the first wick structure 104 of the first housing 10 to the second wick structure 115 of the pipe 11, and has at least one through hole 113, such that the first working fluid 14 in the first inner space 103a can flow to the second inner space 103b via the through hole 113. Therefore, the vapor-liquid circulation of the heat dissipation element 1 is occurred to provide better heat transfer and heat spreading effects.

Figure 15:
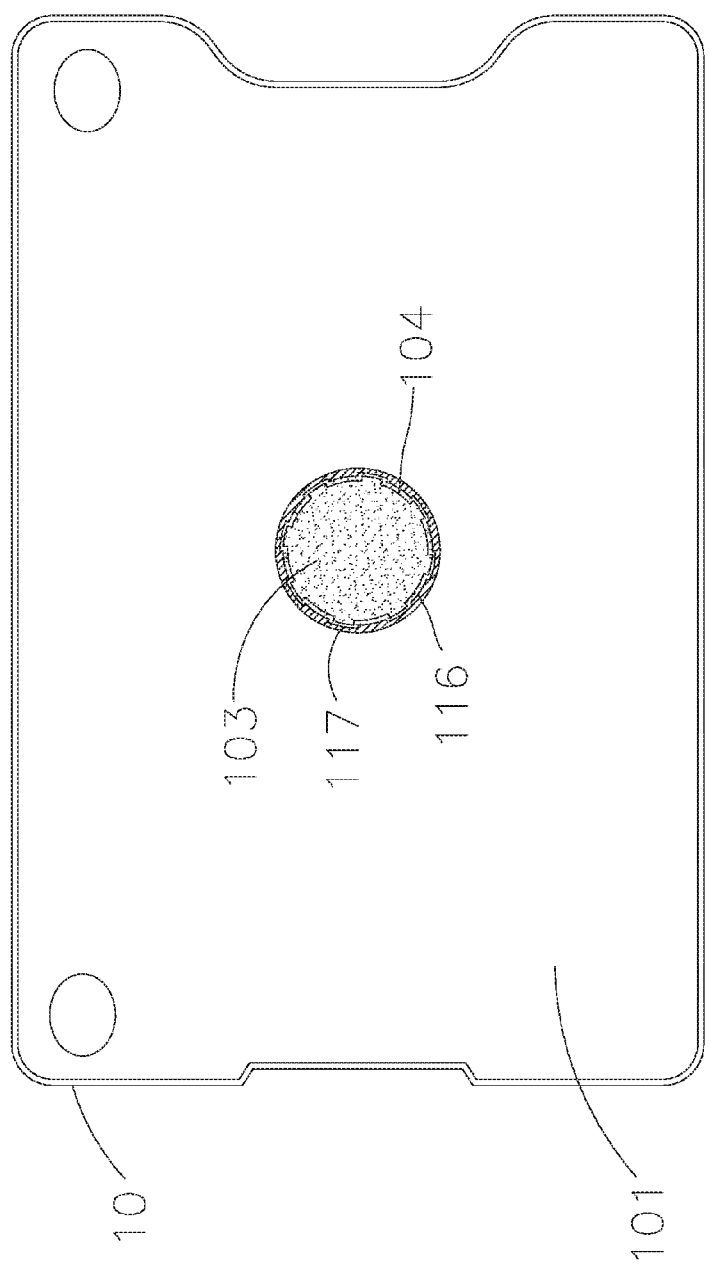
FIG. 15 is a top view of a fifth embodiment of the heat dissipation element according to the present invention.
Figure 16:
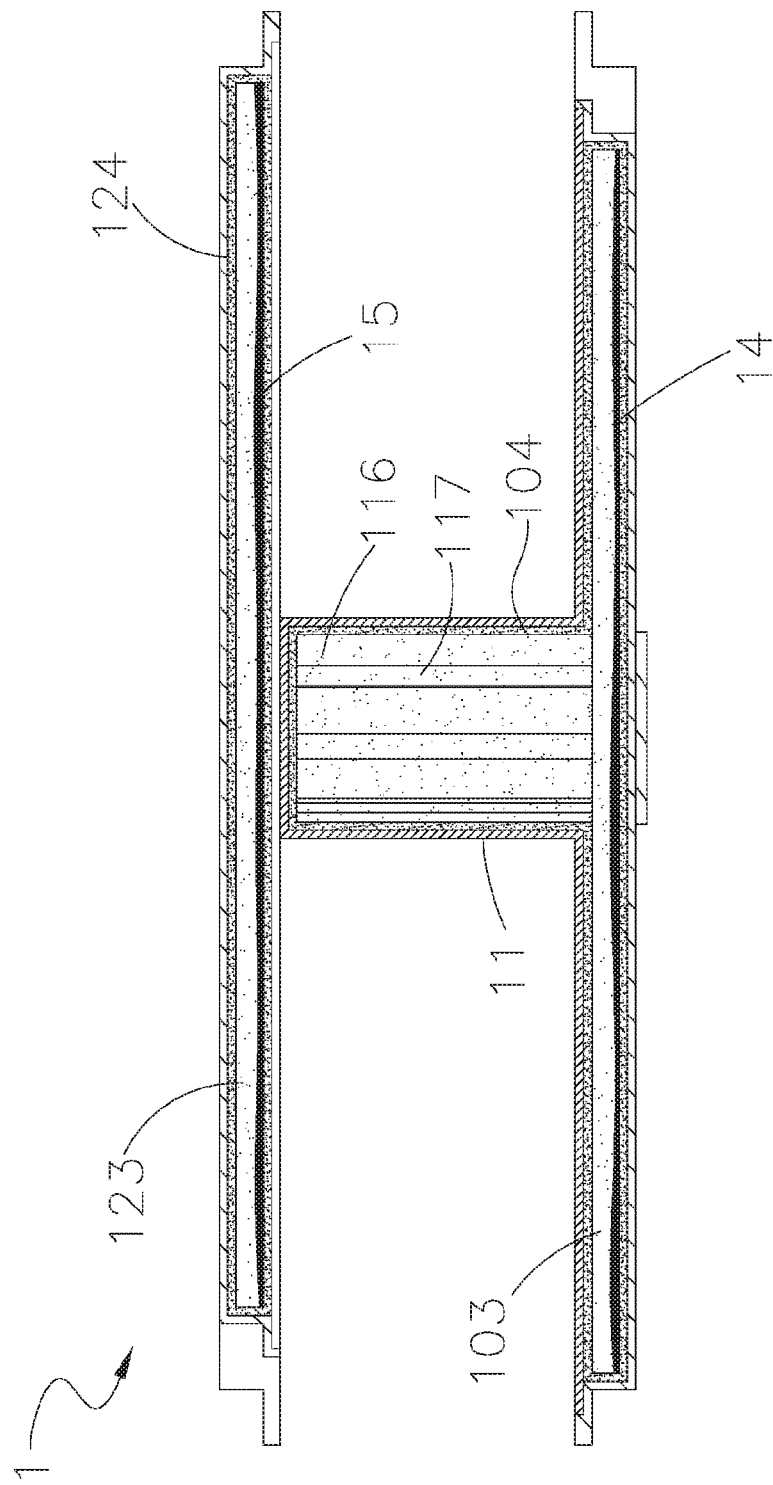
FIG. 16 is an assembled sectional view of the fifth embodiment of the heat dissipation element according to the present invention.

Referring to FIGS. 15 and 16, which are top view and assembled sectional views, respectively, of a fifth embodiment of the heat dissipation element 1 according to the present invention, as shown, the fifth embodiment of the heat dissipation element 1 is generally structurally similar to the first four embodiments except that, in this fifth embodiment, an inner wall of the pipe 11 has a plurality of protrusions 116, which are spaced on an inner periphery of the pipe 11 and extended axially and has at least one recess 117 in between. As shown in FIG. 15, the protrusions 116 are successively spaced like a gear, but not limited to it. The protrusions 116 can be arranged in uneven intervals and the recess 117 can also be other configurations. The first wick structure 104 is provided on surfaces of the protrusions 116 and the recesses 117 of the pipe 11. The protrusions 116 and the recesses 117 give the pipe inner wall an increased area. With the increased area, the number of porous of the porous structure in the first wick structure 104 is also increased, such that the vapor-liquid circulation of the first working fluid 14 in the first chamber 10 occurs more frequently to enhance the overall heat dissipation efficiency.

Figure 17:
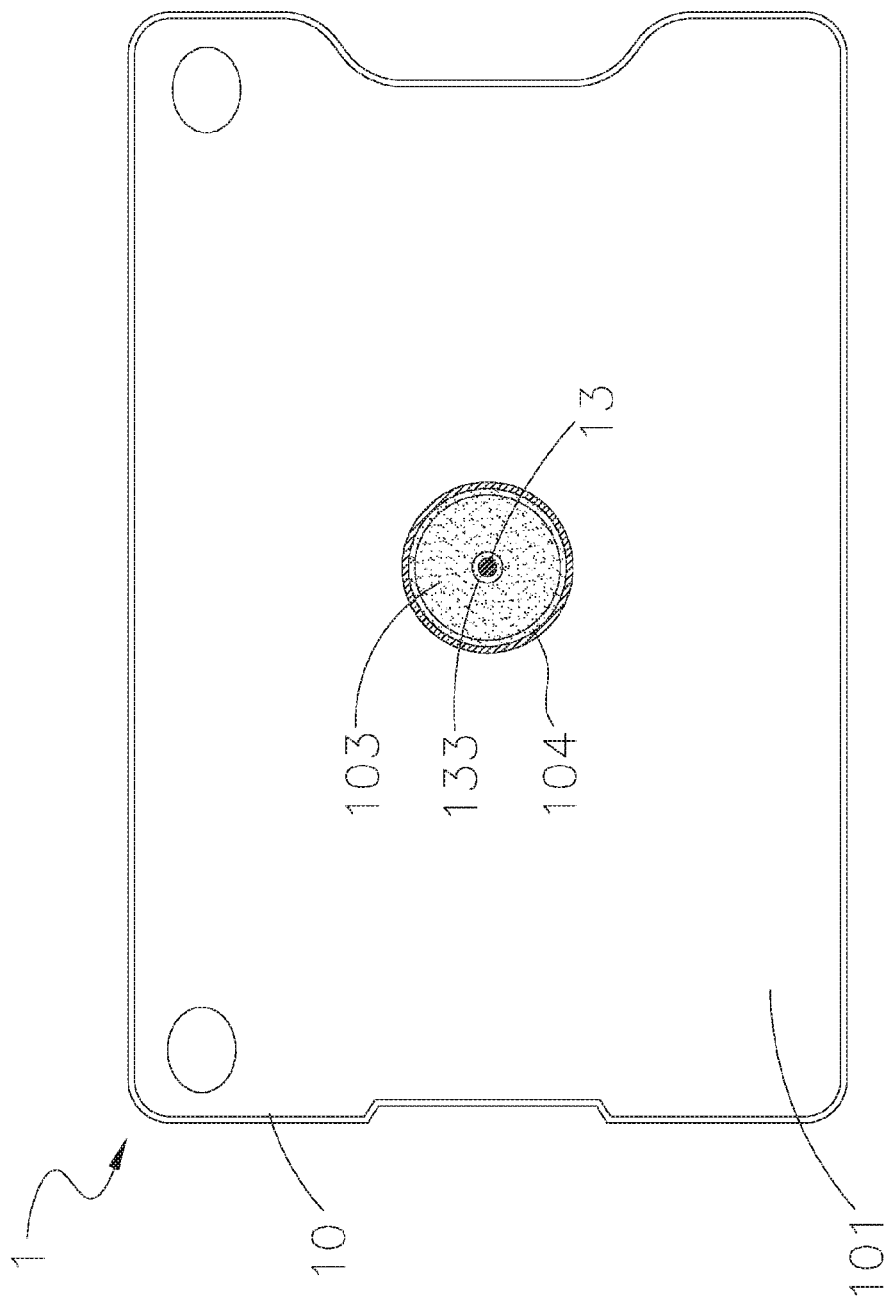
FIG. 17 is a top view of a sixth embodiment of the heat dissipation element according to the present invention.
Figure 18:
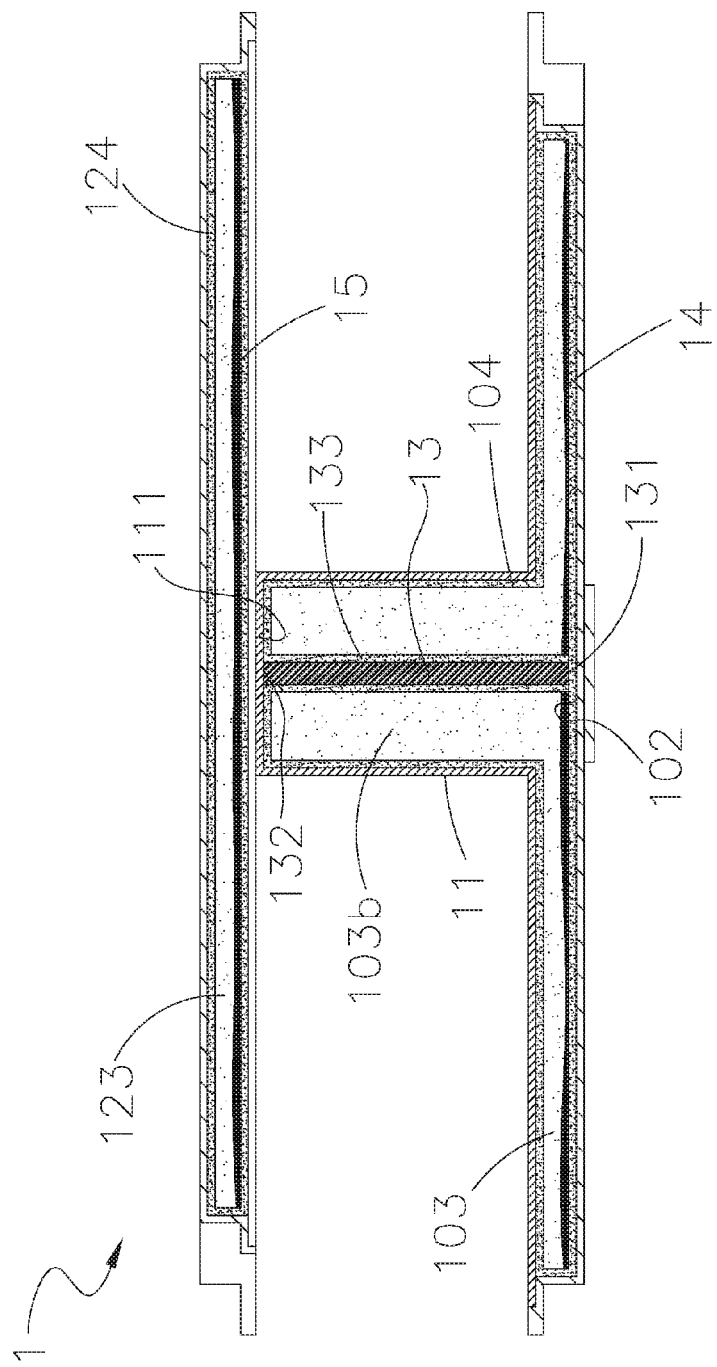
FIG. 18 is an assembled sectional view of the sixth embodiment of the heat dissipation element according to the present invention.

Referring to FIGS. 17 and 18, which are top view and assembled sectional views, respectively, of a sixth embodiment of the heat dissipation element 1 according to the present invention, as shown, the sixth embodiment of the heat dissipation element 1 is generally structurally similar to the first five embodiments except that, in this sixth embodiment, the first chamber 103 has a cylinder 13 located at a center thereof. The cylinder 13 has a first and a second top end 131, 132, which is respectively extended and connected to an inner wall of the second side 102 and an inner wall of the closed end 111 of the pipe 11. A fourth wick structure 133 is provided on the cylinder 13 and the fourth wick structure 133 is made preferably from but not limited to meshes, fiber structure, sintered powder structure, micro grooves, and mesh with sintered powder structure, or any combinations of them. Moreover, since the fourth wick structure 133 is connected to the first wick structure 104 of the first housing 10, the first working fluid 14 in the second inner space 103b can flow back via the first wick structure 104 of the pipe 11 other than flow back via the fourth wick structure 133, such that the vapor-liquid circulation of the first working fluid 14 occurs more quickly in the first chamber 103 to have enhanced heat transfer efficiency.

In brief, the heat dissipation element according to the present invention has the following advantages: (1) being produced at largely lower manufacturing costs; (2) having better heat spreading and heat transfer effect; and (3) providing heat dissipation effect at a remote distance.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation element comprising:
a first vapor chamber housing configured to contact a heat source and having a first plate member and a second plate member closed to each other to internally define a first inner space and at least one opening formed on the first plate member and in fluid communication with the first inner space;
at least one pipe attached to the at least one opening of the first plate member of the first vapor chamber housing and having a second inner space in fluid communication with the first inner space and wherein the first and the second inner space together define a first chamber;
a second vapor chamber housing having a third and fourth plate member closed to each other to internally define a second chamber, wherein the third plate member is connected to one end of the at least one pipe such that the one end of the at least one pipe is arranged outside of the second vapor chamber housing;
a first working fluid heated and vaporized in the first chamber such that a part of the vaporized first working fluid flows towards the first inner space and is condensed into liquid in the first inner space and such that another part of the vaporized first working fluid flows through the at least one pipe into the second inner space and transfers heat to the second vapor chamber housing; and
a second working fluid provided in the second chamber.

2. The heat dissipation element as claimed in claim 1, wherein the at least one pipe has a closed end and an open end, which together internally define the second inner space therebetween and wherein the open end is in fluid communication with the at least one opening, such that the first and the second inner space are in fluid communication with each other.

3. The heat dissipation element as claimed in claim 1, wherein the first and the second chamber are not in fluid communication.

4. The heat dissipation element as claimed in claim 2, wherein the closed end of the at least one pipe is fixedly connected to the third plate member.

5. The heat dissipation element as claimed in claim 4, wherein the first chamber has a first wick structure provided on an inner surface thereof and the second chamber has a second wick structure provided on an inner surface thereof.

6. The heat dissipation element as claimed in claim 5, wherein the first wick structure is provided on an inner surface of the first inner space and a third wick structure is provided on an inner surface of the second inner space and the first and the third wick structures are connected to each other.

7. The heat dissipation element as claimed in claim 6, wherein the first, the second, and the third wick structures are made of a material selected from the group consisting of meshes, fiber structure, sintered powder structure, micro grooves, and mesh with sintered powder structure, and any combinations of them.

8. The heat dissipation element as claimed in claim 4, wherein the open end of the at least one pipe is pressed against an inner wall of the second plate member and has at least one through hole.

9. The heat dissipation element as claimed in claim 4, wherein the first plate member of the first vapor chamber housing further has a raised portion upwardly extended therefrom; and the raised portion is correspondingly formed on a periphery of the at least one opening of the first vapor chamber housing.

10. The heat dissipation element as claimed in claim 4, wherein the closed end of the at least one pipe is fixedly connected to the third plate member of the second vapor chamber housing in a way selected from the group consisting of welding, mechanical processing, adhesive bonding, and direct attaching.

11. The heat dissipation element as claimed in claim 6, wherein an inner wall of the at least one pipe has a plurality of protrusions spaced on an inner surface of the at least one pipe and extended axially and having at least one recess in between and wherein the third wick structure is provided on surfaces of the protrusions and the recess of the at least one pipe.

12. The heat dissipation element as claimed in claim 6, wherein a cylinder is provided at a center of the first chamber and has a first and a second end, which are respectively extended to connect to the second plate member and the closed end of the at least one pipe, and a fourth wick structure is provided on a surface thereof and made of a material selected from the group consisting of meshes, fiber structure, sintered powder structure, micro grooves, and mesh with sintered powder structure, and any combinations of them.

13. The heat dissipation element as claimed in claim 2, wherein the at least one pipe is a heat pipe.

* * * * *